United States Patent [19]
Johnson et al.

[11] Patent Number: 5,120,989
[45] Date of Patent: Jun. 9, 1992

[54] SIMPLIFIED CLOCK DISTRIBUTION IN ELECTRONIC SYSTEMS

[75] Inventors: Douglas C. Johnson, Ocean; Arnold Bard, Elberon; Patrick F. McHugh, West Long Branch, all of N.J.

[73] Assignee: The United States of America as represented by the Secretary of the Army, Washington, D.C.

[21] Appl. No.: 652,706

[22] Filed: Feb. 4, 1991

[51] Int. Cl.$^5$ ............................................. H03K 5/00
[52] U.S. Cl. .................................. 307/269; 307/271; 328/20
[58] Field of Search ............... 307/260, 269, 271, 522, 307/529; 328/15, 20

[56] References Cited
U.S. PATENT DOCUMENTS
4,737,721  4/1988  Lippl ................................ 328/20 X FOREIGN PATENT DOCUMENTS
0081513  3/1990  Japan .................................. 307/529

OTHER PUBLICATIONS

Merson, "Digital Multiplier", RCA TN No. 736, Jan. 1968.
Hernandez, Jr., "Frequency Multiplier Using Delay Circuits", IBM Technical Disclosure Bulletin, vol. 26, No. 3A, Aug. 1983, pp. 990–991.

Primary Examiner—Robert J. Pascal
Attorney, Agent, or Firm—Michael Zelenka; John M. O'Meara

[57] ABSTRACT

Drive signals generated at a single location are utilized to derive localized clock signals at several locations. The drive signals are phase shifted and have identical frequencies, while the clock signals derived therefrom are some frequency multiple thereof.

8 Claims, 4 Drawing Sheets

SIMPLIFIED CLOCK DISTRIBUTION IN ELECTRONIC SYSTEMS

GOVERNMENT INTEREST

The invention described herein may be manufactured, used, and licensed by or for the government for governmental purposes without payment to us of any royalties thereon.

BACKGROUND OF THE INVENTION

The present invention relates generally to electronic systems and more particularly, to a clock distribution scheme for conserving available integrated circuitry resources.

In electronic systems such as those found in avionics or computers, clock signals control or synchronize the sequencing of various functions therein. The clock signals are distributed throughout such systems by interconnects which in modern technology can be etched from copper cladding or accomplished through optical fibers. Those skilled in the art of electronic systems are very familiar with this technology and realize that circuit modules dedicated to perform particular functions are distributed throughout such systems, with interconnects provided therebetween. Interconnects of copper cladding are most commonly found where the bounds of the electronic system are determined by a mother board or backplane. Of course, each module is mechanically and electrically interfaced with the backplane through a connector which has a single pin for each interconnect passing therebetween.

Each clock signal has a characteristic frequency and most electronic systems utilize a plurality of clock signals. In many electronic systems, most of the clock signals are also utilized in more than one module. Therefore to avoid clock skewing which occurs when there is a phase difference between the effect of the same clock signal in two or more circuit modules and to conserve the circuitry capacity of the modules, it has become conventional design in most electronic systems to derive all clock signals from one oscillator circuit within a single circuit module and distribute those signals to the other modules through interconnects. With this design approach however, the complexity of the oscillator circuit increases as the number of clock signals increases for any electronic system. Such increases in clock signals also tax the capability to provide interconnects, particularly in electronic systems having backplanes wherein the capability of the connectors to provide pins may also be taxed. Of course, these capabilities are even more severely taxed when redundant clock signals are required for the sake of reliability or return grounds are required for each clock signal. The interconnect capability is also severely taxed because each clock signal must have the same length of interconnect extending to each module, if clock skewing is to be avoided. Furthermore, high frequency clock signals generally encounter lower impedance loading which can become prohibitive as the number of circuit modules driven thereby and/or the length of interconnect required thereby, are increased.

SUMMARY OF THE INVENTION

It is the general object of the present invention to facilitate the generation of clock signals in electronic systems for purposes of conservation therein relative to module circuitry and quantity of interconnects.

It is a specific object of the present invention to accomplish the above-stated general object by conserving circuit module resources through the derivation of clock signals for each module with circuitry located therein to which drive signals are applied from circuitry that is common for all circuit modules.

It is another specific object of the present invention to accomplish the above-stated general object by conserving interconnect resources through the use of clock signal frequencies equal to some multiple of the drive signal frequencies.

These and other objects are accomplished in accordance with the present invention by applying at least one pair of phase shifted drive signals having identical frequencies to each circuit module. Such drive signals are combined within each circuit module to derive the clock signals therefor having frequencies equal to some multiple of the drive signal frequency. Arrangements of exclusive OR gates are disclosed for combining the drive signals in the preferred embodiments of the invention.

The scope of the present invention is only limited by the appended claims for which support is predicated on the preferred embodiments hereinafter set forth in the following description and the attached drawings wherein like reference characters relate to like parts throughout the several figures.

DESCRIPTION OF THE PREFERRED EMBODIMENTS

Figure 1:
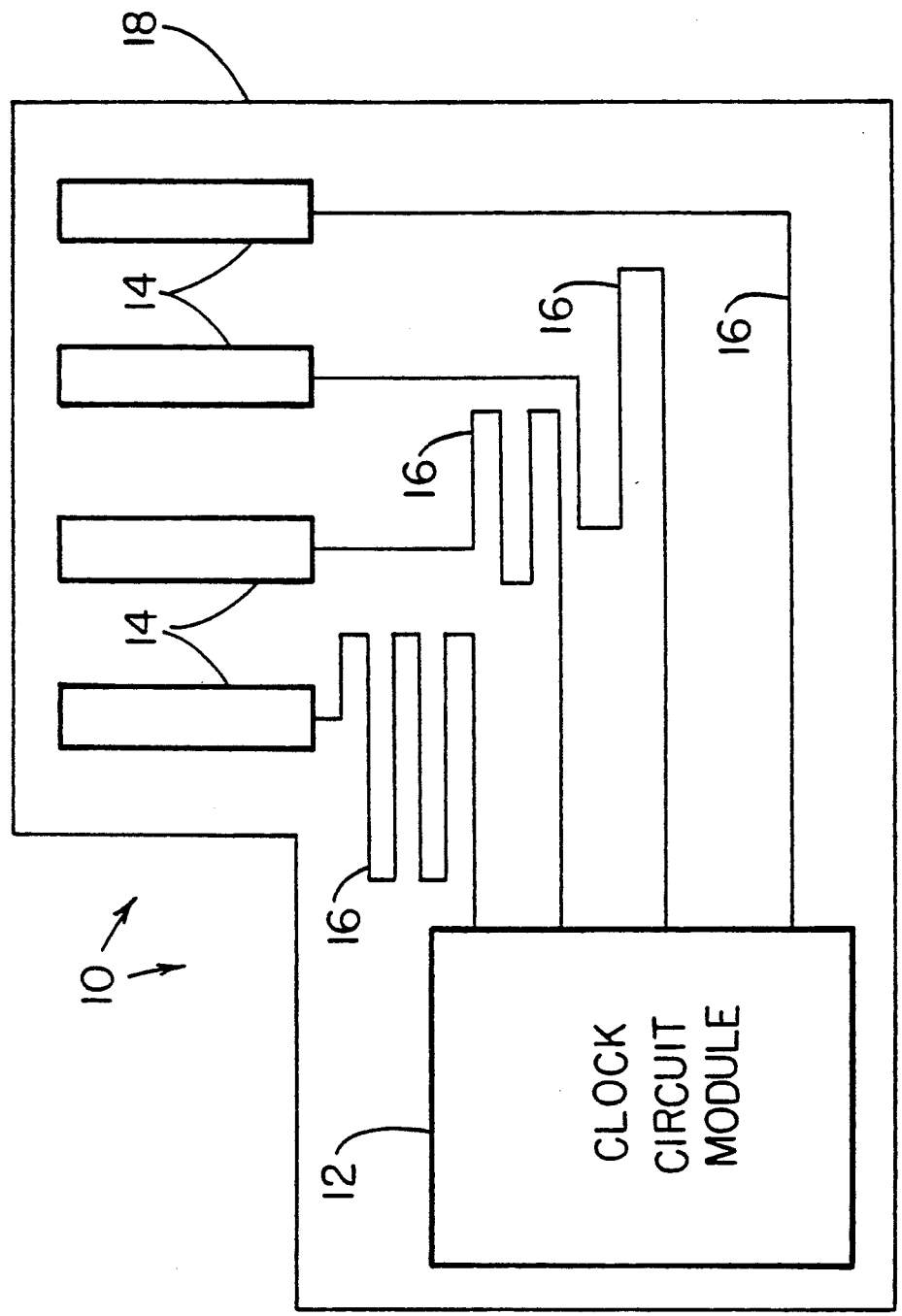
FIG. 1 illustrates the most common arrangement for generating and distributing clock signals in prior art electronic systems.

As shown in FIG. 1, most prior art electronic systems 10 derive all clock signals therefor in a clock circuit module 12 and distribution thereof to other circuit modules 14 is accomplished through interconnects 16, such as those of the conductive type which are found on a mother-board or backplane 18. Although such clock signals may not have identical frequencies, to synchronize the functions of the circuit modules 14, such frequencies must be multiples of each other. However, the interconnects 16 must be the same length to every circuit module 14 for each clock signal, to avoid clock skewing. As is apparent from FIG. 1, this requirement severely taxes the interconnect resources of the backplane 18, especially when a plurality of clock signals are utilized by each circuit module 14. Consequently, the inexperienced observer may conclude that it would be a better design approach to derive the clock signals within each circuit module 14. But such an approach would require that an oscillator circuit be incorporated into each circuit module 14 which would usually include a relatively expensive crystal unit and require a greatly expanded temperature compensation means therefor relative to that utilized for the clock circuit module 12. Before the invention disclosed herein was made consequently, the FIG. 1 approach to the generation and distribution of clock signals was reasonable.

Figure 2:
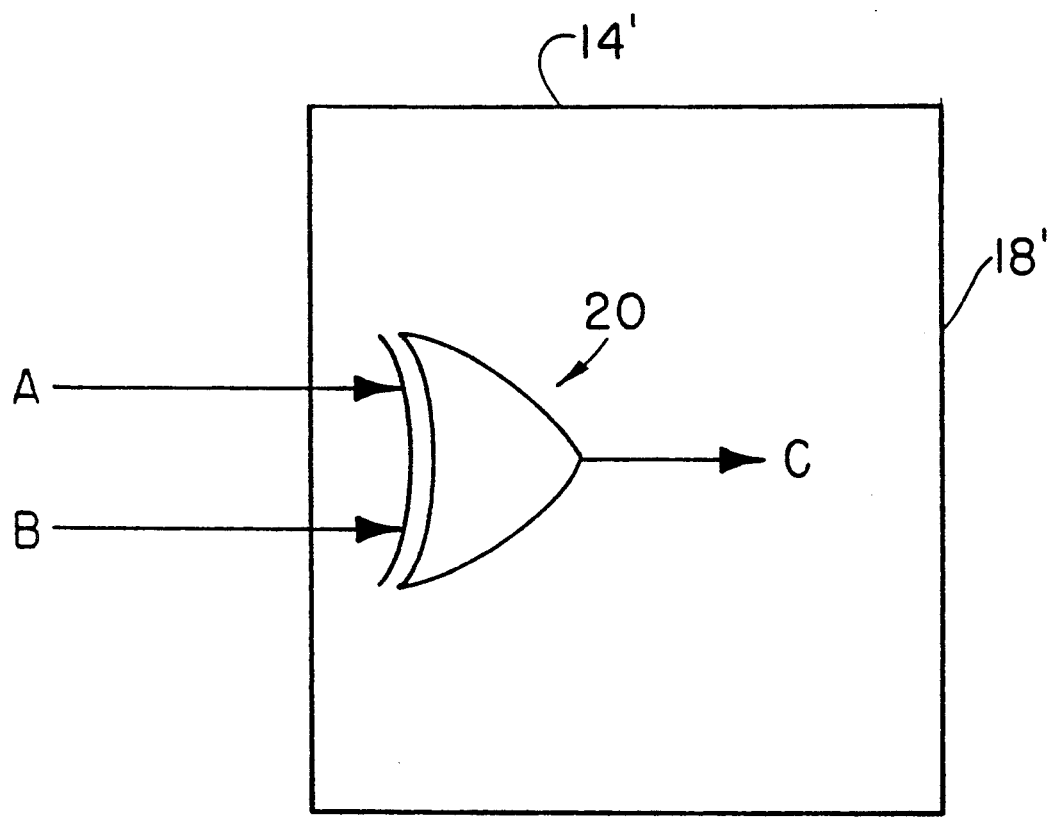
FIG. 2 illustrates one preferred embodiment for the clock signal generating scheme of the invention.
Figure 3:
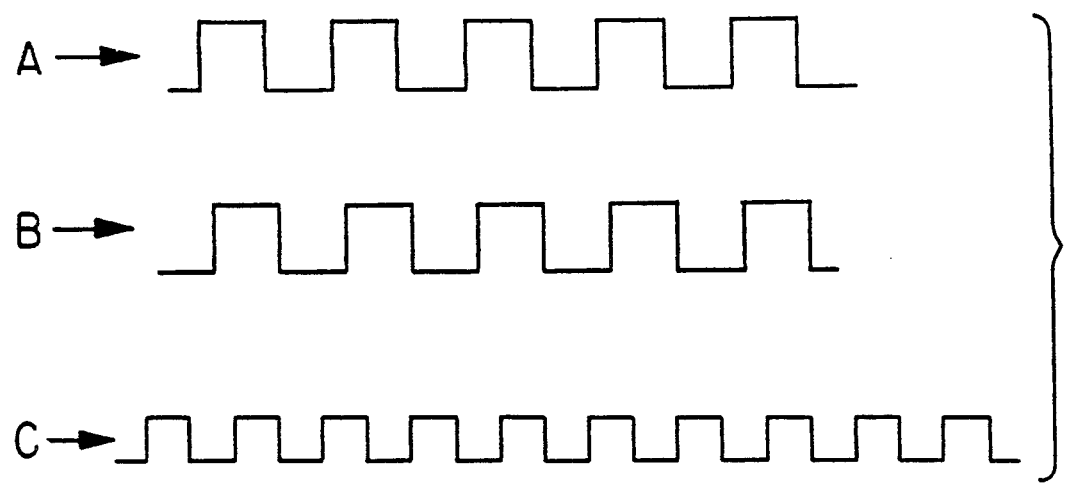
FIG. 3 is an amplitude vs. time diagram for the drive and clock signals in FIG. 2.

A circuit module 14' having a clock signal C derived therein according to the concept of this invention, is shown in FIG. 2. Phase shifted drive signals A and B of identical frequencies are applied to the circuit module 14'. Means 20, such as an exclusive OR gate, is included for combining the drive signals A and B to generate the clock signal C at a frequency equal to twice the frequency of the individual drive signals A and B. The operational diagram for clock generating means 20 is shown in FIG. 3, which of course complies with the functional aspects of the exclusive OR gate in that an output is produced therefrom only when a high level signal is applied to either but not both inputs thereof. In FIG. 3, drive signals A and B are phase shifted by ninety degrees with each having a duty cycle of fifty percent, so as to generate clock signal C with a duty cycle of fifty percent. Clock signal C will have the same frequency regardless of the phase shift magnitude however, the duty cycle magnitude thereof is directly proportional to that phase shift magnitude. Consequently, for a phase shift of forty five degrees, a twenty five percent duty cycle is derived and for a phase shift of one hundred thirty five degrees, a seventy five percent duty cycle is derived. Otherwise, the duty cycles of drive signals A and B may also be fixed to determine the duty cycle of the clock signal C.

Figure 4:
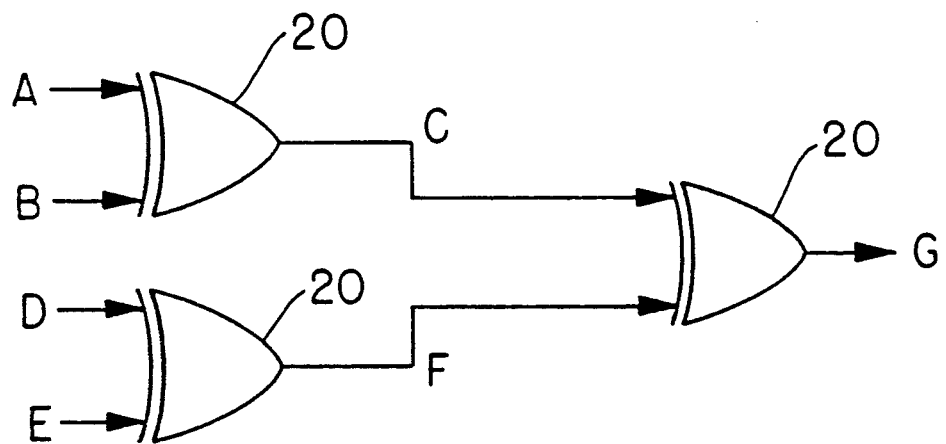
FIG. 4 illustrates another preferred embodiment for the clock signal generating scheme of the invention.
Figure 5:
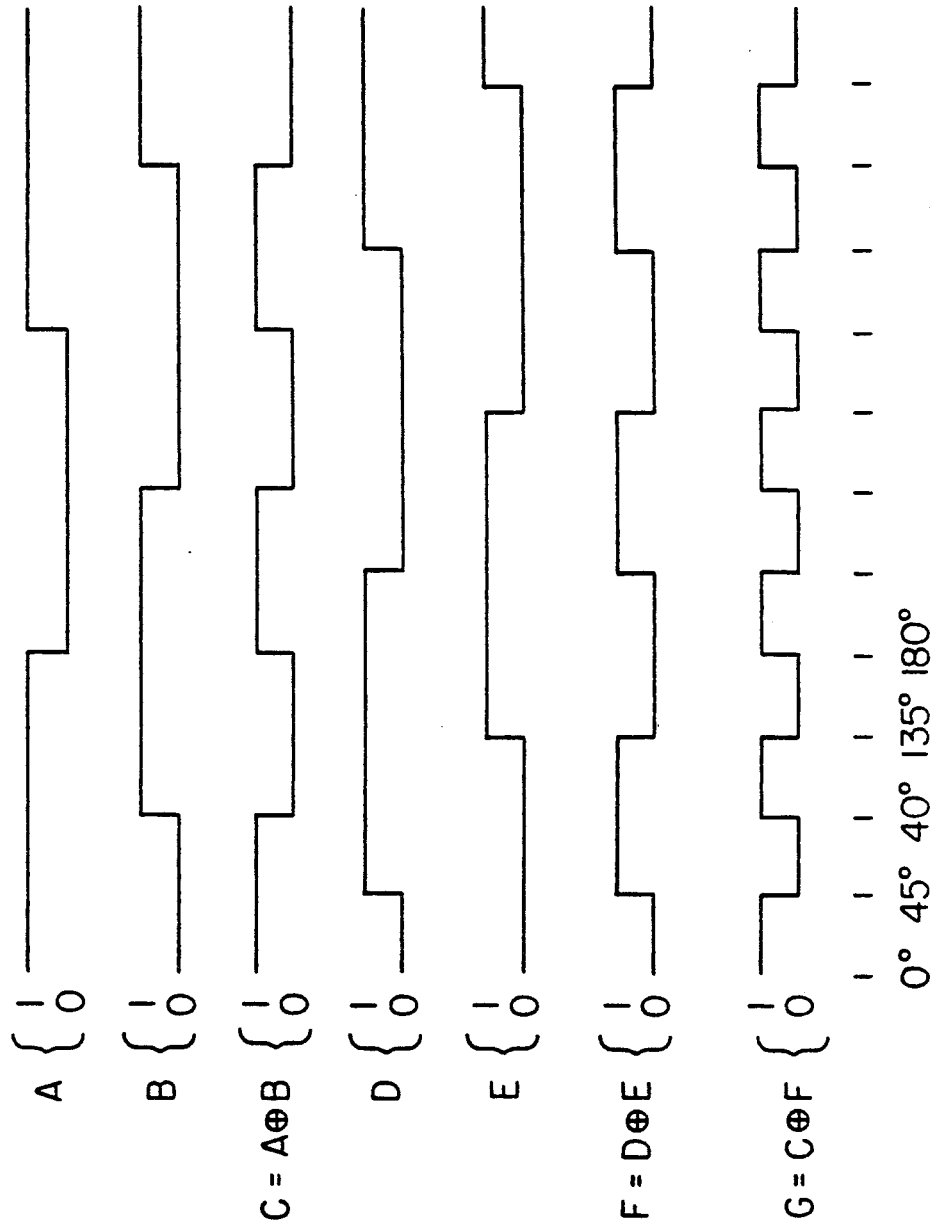
FIG. 5 is an amplitude vs. time diagram for the drive and clock signals in FIG. 4.

A plurality of clock signals having frequencies which progress in multiples, can also be derived in other embodiments of the invention by employing a plurality of clock generating means 20, as shown in FIG. 4. To facilitate an understanding of the FIG. 4 embodiment, clock signal C is generated therein from drive signals A and B in the same manner as previously discussed in regard to the FIG. 2 embodiment. Phase shifted drive signals D and E of the same frequency as drive signals A and B are applied to another clock signal generating means 20 from which a clock signal F is derived in the same manner as previously discussed regarding clock signal C. Clock signals C and F are then applied as drive signals to still another clock signal generating means 20 to generate clock signal G at a frequency equal to twice the frequency of the individual drive signals C and F. The operational diagram for the FIG. 4 embodiment is shown in FIG. 5 wherein drive signals D and E are phase shifted by ninety degrees, with each having a fifty percent duty cycle. Drive signals D and E are also phase shifted by forty five degrees relative to drive signals A and B respectively. With the FIG. 4 embodiment therefore, signals at a basic frequency, at two times the basic frequency, and at four times the basic frequency are available for clocking purposes.

Many advantages result when clock signals are generated using the concept of this invention. Exclusive OR gates or their functional equivalents consume little in the way of available circuitry and volume within the circuit modules 14'. Also, very high clock signal frequencies can be generated from very low drive signal frequencies which of course, keeps impedance loading to a minimum. Otherwise, to derive the drive signals A, B, D and E from common circuitry (not shown) which is accessible to all the circuit modules 14 in the electronic system 10, greatly facilitates the design thereof especially when that circuitry includes a crystal. Furthermore, when three or more clock signals are required by circuit modules 14', the drive signals are conveyed thereto through fewer interconnects 16 than would be the case if those clock signals were conveyed directly to circuit modules 14 in accordance with prior art electronic systems 10.

Those skilled in the electronic arts will appreciate without further explanation that within the concept of this invention, many modifications and variations are possible to the above disclosed embodiments of the clock generating means 20. Consequently, it should be understood that all such modifications and variations fall within the scope of the following claims.

What we claim is:

1. In an electronic system having circuit modules which communicate through interconnects therebetween, with the operation of each circuit module requiring at least one clock signal, the improvement comprising:
   each circuit module includes means for combining externally applied, phase shifted drive signals of identical frequency to derive at least one clock signal therein having some frequency multiple of the drive signals.

2. The system of claim 1 wherein a clock signal for at least one module is derived at twice the frequency of the drive signals.

3. The system of claim 2 wherein the clock signal is derived at the output of an exclusive OR gate having the drive signals applied individually to the inputs thereof.

4. The system of claim 1 wherein the clock signals for at least one module are derived from the outputs of exclusive OR gates at twice the frequencies of drive signals which are applied individually to the inputs thereof.

5. In an electronic system having a plurality of circuit modules which communicate through interconnects therebetween, with the operation of each such circuit module requiring at least one clock signal, the improvement comprising:
   at least one circuit module includes means for combining externally applied, phase shifted drive signals of identical frequency to derive at least one clock signal therein having some frequency multiple of the drive signals.

6. The system of claim 5 wherein a clock signal for at least one module is derived at twice the frequency of the drive signals.

7. The system of claim 6 wherein the clock signal is derived at the output of an exclusive OR gate having the drive signals applied individually to the inputs thereof.

8. The system of claim 5 wherein the clock signals for at least one module are derived from the outputs of exclusive OR gates at twice the frequencies of drive signals which are applied individually to the inputs thereof.

* * * * *